(12) United States Patent
Roach

(10) Patent No.: US 8,098,181 B2
(45) Date of Patent: Jan. 17, 2012

(54) ATTENUATOR CIRCUIT

(75) Inventor: Steven D. Roach, Colorado Springs, CO (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 12/769,114

(22) Filed: Apr. 28, 2010

(65) Prior Publication Data

US 2011/0267214 A1 Nov. 3, 2011

(51) Int. Cl.
*H03M 1/12* (2006.01)
*H03G 3/00* (2006.01)
*H03F 3/68* (2006.01)

(52) U.S. Cl. ........ 341/155; 341/156; 330/126; 330/282; 330/284

(58) Field of Classification Search .................. 341/155, 341/156; 330/126, 282, 284, 295; 455/232.1; 702/66, 67, 70, 79
See application file for complete search history.

(56) References Cited

U.S. PATENT DOCUMENTS

| | | |
|---|---|---|
| 2,778,883 A | 1/1957 | Buckerfield |
| 3,573,644 A | 4/1971 | Evel |
| 4,147,988 A | 4/1979 | Hall |
| 4,283,713 A | 8/1981 | Philipp |
| 4,365,193 A | 12/1982 | Bollero et al. |
| 4,495,586 A | 1/1985 | Andrews |
| 4,507,618 A | 3/1985 | Nelson |
| 4,523,161 A | 6/1985 | Miles |
| 4,678,345 A | 7/1987 | Agoston |
| 4,694,244 A | 9/1987 | Whiteside et al. |
| 4,704,036 A | 11/1987 | Holte et al. |
| 4,716,345 A | 12/1987 | Shank et al. |
| 4,755,951 A | 7/1988 | Hollister |
| 4,779,045 A | 10/1988 | Shank |
| 4,855,968 A | 8/1989 | Shank |
| 5,034,698 A | 7/1991 | Moriyasu |
| 5,121,075 A | 6/1992 | Roach |
| 5,223,784 A | 6/1993 | Nelson et al. |
| 5,315,627 A | 5/1994 | Draving |
| 5,754,827 A | 5/1998 | Barbier et al. |
| 5,777,489 A | 7/1998 | Barbier et al. |
| 5,933,129 A | 8/1999 | Egami et al. |
| 6,057,706 A | 5/2000 | Barbier et al. |
| 6,218,904 B1 | 4/2001 | Panther |

(Continued)

FOREIGN PATENT DOCUMENTS

AT 264510 4/2004

(Continued)

OTHER PUBLICATIONS

Roach, Steven D., "Signal Conditioning in Oscilloscopes and the Spirit of Invention", in The Art and Science of Analog Circuit Design, ed. Jim Williams, Butterworth-Heinemann, Boston (1995).

(Continued)

*Primary Examiner* — Jean B Jeanglaude
(74) *Attorney, Agent, or Firm* — Fish & Richardson P.C.

(57) ABSTRACT

An attenuator circuit includes a high-frequency circuit path to produce an attenuated first signal; a low-frequency circuit path to produce an attenuated second signal, where the attenuated first signal has a higher frequency than the attenuated second signal; and a transistor that includes a control input. The control input is configured to receive the attenuated second signal to bias the transistor for passage of the attenuated first signal and the attenuated second signal.

15 Claims, 7 Drawing Sheets

U.S. PATENT DOCUMENTS

| | | |
|---|---|---|
| 6,265,894 B1 | 7/2001 | Reblewski et al. |
| 6,388,465 B1 | 5/2002 | Barbier et al. |
| 6,560,494 B1 | 5/2003 | Soto et al. |
| 6,681,354 B2 | 1/2004 | Gupta |
| 6,717,433 B2 | 4/2004 | Barbier et al. |
| 6,782,298 B2 | 8/2004 | Soto et al. |
| 6,801,097 B2 | 10/2004 | Wallace |
| 6,807,496 B2 | 10/2004 | Pickerd |
| 6,832,174 B2 | 12/2004 | Tran et al. |
| 6,909,979 B2 | 6/2005 | Saitou et al. |
| 7,058,548 B2 | 6/2006 | Pupalaikis et al. |
| 7,065,458 B2 | 6/2006 | Tran et al. |
| 7,139,684 B2 | 11/2006 | Pupalaikis et al. |
| 7,191,079 B2 | 3/2007 | Smith et al. |
| 7,191,372 B1 | 3/2007 | Jacobson et al. |
| 7,219,037 B2 | 5/2007 | Pupalaikis et al. |
| 7,222,055 B2 | 5/2007 | Pupalaikis et al. |
| 7,236,900 B2 | 6/2007 | Hagen et al. |
| 7,280,930 B2 | 10/2007 | Kobayashi |
| 7,285,946 B2 | 10/2007 | Ems et al. |
| 7,304,550 B2 | 12/2007 | Rostami et al. |
| 7,365,617 B2 | 4/2008 | Rostami et al. |
| 7,373,281 B2 | 5/2008 | Pupalaikis et al. |
| 7,386,409 B2 | 6/2008 | Mueller et al. |
| 7,519,513 B2 | 4/2009 | Pupalaikis et al. |
| 7,646,766 B2 | 1/2010 | Schmidt et al. |
| 2002/0089349 A1 | 7/2002 | Barbier et al. |
| 2002/0104051 A1 | 8/2002 | Gupta |
| 2003/0208330 A1 | 11/2003 | Pickerd |
| 2003/0223317 A1 | 12/2003 | Soto et al. |
| 2004/0012454 A1 | 1/2004 | Wallace |
| 2004/0117138 A1 | 6/2004 | Tran et al. |
| 2004/0117143 A1 | 6/2004 | Tran et al. |
| 2004/0128076 A1 | 7/2004 | Pupalaikis et al. |
| 2004/0178820 A1 | 9/2004 | Barbier et al. |
| 2005/0089883 A1 | 4/2005 | Weinrich et al. |
| 2005/0118971 A1* | 6/2005 | Arai et al. ............ 455/232.1 |
| 2005/0225310 A1 | 10/2005 | Smith et al. |
| 2005/0234670 A1 | 10/2005 | Hagen et al. |
| 2006/0044040 A1* | 3/2006 | Kawai .................... 327/308 |
| 2006/0074606 A1 | 4/2006 | Pupalaikis et al. |
| 2006/0080065 A1 | 4/2006 | Pupalaikis et al. |
| 2006/0161401 A1 | 7/2006 | Pupalaikis et al. |
| 2006/0176151 A1 | 8/2006 | Ems et al. |
| 2006/0177018 A1 | 8/2006 | Kobayashi et al. |
| 2006/0178850 A1 | 8/2006 | Kobayashi |
| 2006/0195301 A1 | 8/2006 | Mueller et al. |
| 2006/0238270 A1 | 10/2006 | Rostami et al. |
| 2007/0027658 A1 | 2/2007 | Pupalaikis et al. |
| 2007/0112532 A1 | 5/2007 | Pupalaikis et al. |
| 2007/0126525 A1 | 6/2007 | Nicholson |
| 2007/0185669 A1 | 8/2007 | Pupalaikis et al. |
| 2007/0247256 A1 | 10/2007 | Rostami et al. |
| 2008/0054967 A1 | 3/2008 | Kobayashi |
| 2008/0120053 A1 | 5/2008 | Pupalaikis et al. |
| 2008/0130654 A1 | 6/2008 | Schmidt et al. |
| 2008/0258957 A1 | 10/2008 | Pupalaikis et al. |
| 2009/0002213 A1 | 1/2009 | LaMarche et al. |

FOREIGN PATENT DOCUMENTS

| | | |
|---|---|---|
| AU | 200027578 | 4/2001 |
| AU | 2003252059 | 2/2004 |
| AU | 2003291653 | 5/2004 |
| CA | 1126866 | 6/1982 |
| CA | 1203295 | 4/1986 |
| CA | 1278344 | 12/1990 |
| CA | 2238955 | 11/1999 |
| CA | 2272740 | 11/1999 |
| CA | 2353950 | 4/2001 |
| CN | 1399724 | 2/2003 |
| CN | 1675822 | 9/2005 |
| CN | 1723621 | 1/2006 |
| CN | 101116066 | 1/2008 |
| DE | 2824103 | 12/1978 |
| DE | 3065612 | 12/1983 |
| DE | 3335868 | 4/1984 |
| DE | 60009856 | 5/2004 |
| DE | 102004019966 | 11/2005 |
| DE | 102006040793 | 6/2007 |
| EP | 0023708 | 2/1981 |
| EP | 0250682 | 1/1988 |
| EP | 0278637 | 8/1998 |
| EP | 1133702 | 9/2001 |
| EP | 1359427 | 11/2003 |
| EP | 1554807 | 7/2005 |
| EP | 1738185 | 1/2007 |
| EP | 1836586 | 9/2007 |
| EP | 1846770 | 10/2007 |
| EP | 1847103 | 10/2007 |
| FR | 2393472 | 12/1978 |
| FR | 2534090 | 4/1984 |
| GB | 1583550 | 1/1981 |
| GB | 2130038 | 5/1984 |
| GB | 2433659 | 6/2007 |
| IN | 00025CN2005 | 4/2007 |
| IT | 1119341 | 3/1986 |
| JP | 54-002019 | 1/1979 |
| JP | 59-086322 | 5/1984 |
| JP | 63-5270 | 1/1988 |
| JP | 63-193068 | 8/1988 |
| JP | 02-007609 | 1/1990 |
| JP | 02-052282 | 2/1990 |
| JP | 03-211695 | 9/1991 |
| JP | 04-212067 | 8/1992 |
| JP | 06-034666 | 2/1994 |
| JP | 09-318669 | 12/1997 |
| JP | 2002-544576 | 12/2002 |
| JP | 2003-329709 | 11/2003 |
| JP | 2006-504100 | 2/2006 |
| JP | 2007-159118 | 6/2007 |
| JP | 2008-521014 | 6/2008 |
| MX | PA05000704 | 4/2005 |
| NL | 7806065 | 12/1978 |
| NL | 8303383 | 5/1984 |
| NL | 8901648 | 1/1990 |
| NL | 187880 | 9/1991 |
| TW | 339409 | 9/1998 |
| WO | WO01/23901 | 4/2001 |
| WO | WO2004/010571 | 1/2004 |
| WO | WO2004/038432 | 5/2004 |
| WO | WO2005/103736 | 11/2005 |
| WO | WO2006/055935 | 5/2006 |
| WO | WO2006/086256 | 8/2006 |
| WO | WO2006/086257 | 8/2006 |
| WO | WO2006/086258 | 8/2006 |
| WO | WO2006/093541 | 9/2006 |

OTHER PUBLICATIONS

White Paper "XYZs of Oscilloscopes: Primer", TEK1511 / 03W-8605-5, © 2009 Tektronix.

Agilent Technologies Application Note 1608, "What is the difference between an equivalent time sampling oscilloscope and a real-time oscilloscope?", 5989-8794EN, © 2008 Agilent Technologies, Inc.

Search Report for U.S. Appl. No. 12/769,065, entitled "Fixed-Price Novelty Search Report" (2010).

Search Report for U.S. Appl. No. 12/769,082, entitled "Fixed-Price Novelty Search Report" (2010).

Search Report for U.S. Appl. No. 12/769,114, entitled "Fixed-Price Novelty Search Report" (2010).

Search Report for U.S. Appl. No. 12/769,075, entitled "Fixed-Price Novelty Search Report" (2010).

Action and Response History in US Publication No. US2004/0117138, as retrieved on Jul. 20, 2010.

File History for US Patent No. 5,121,075 (Issue Date: Jun. 9, 1992).

Teradyne, Inc., "Prior Art Fig. 1: Ai760 DSO Rev A showing differential drive comparators with trigger level control . . . ", (Aug. 2007).

Teradyne, Inc., "Prior Art Fig. 1: Ai760 Rev A DSO and prior art references listed in Section 7", (Aug. 2007).

* cited by examiner

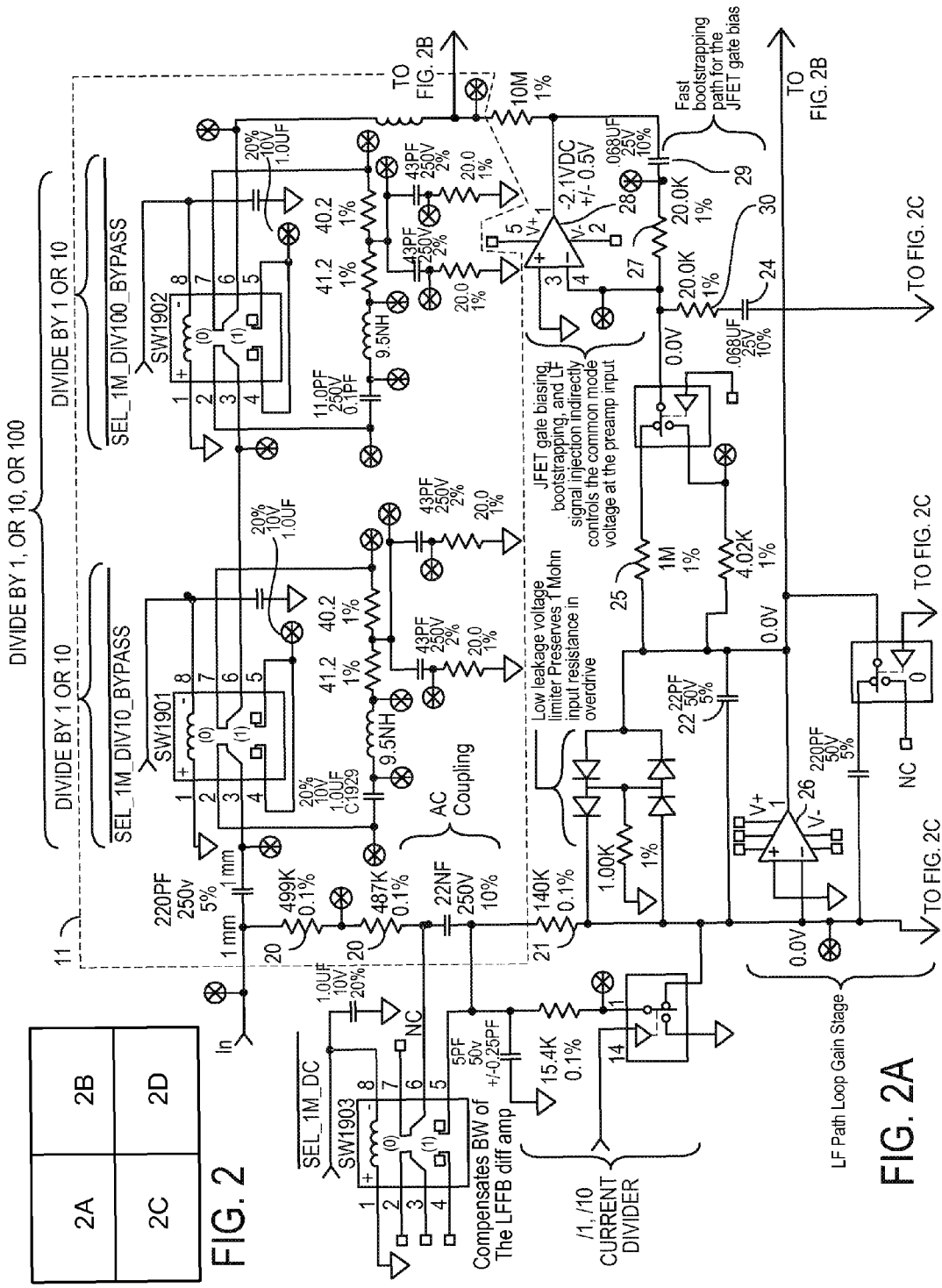

ATTENUATOR CIRCUIT

CROSS-REFERENCE TO RELATED APPLICATIONS

The following patent applications, all of which were filed on the same day, are related: (1) U.S. patent application Ser. No. 12/769,065, entitled "Connecting Digital Storage Oscilloscopes", (2) U.S. patent application Ser. No. 12/769,082, entitled "Driving An Electronic Instrument", and (3) U.S. patent application Ser. No. 12/769,075, entitled "Multi-Level Triggering Circuit". The disclosure of each of these patent applications is hereby incorporated by reference into this patent application as if set forth herein in full.

TECHNICAL FIELD

This patent application describes an attenuator circuit.

BACKGROUND

An attenuator circuit reduces characteristics of a signal, such as amplitude, without substantially distorting the signal's waveform. For example, an attenuator circuit may convert high-amplitude input signals to lower-amplitude signals that can be processed by an electronic instrument. One such instrument is a digital storage oscilloscope (DSO). A DSO is typically configured to convert input analog signals to digital form, store those signals, and process the signals for display, typically on a liquid crystal display (LCD) device.

SUMMARY

This patent application describes an attenuator circuit.

For example, this patent application describes an attenuator circuit that includes a high-frequency circuit path to produce an attenuated first signal; a low-frequency circuit path to produce an attenuated second signal, where the attenuated first signal has a higher frequency than the attenuated second signal; and a transistor that includes a control input. The control input is configured to receive the attenuated second signal to bias the transistor for passage of the attenuated first signal and the attenuated second signal. The attenuator circuit may include one or more of the following features, either alone or in combination.

The low-frequency circuit path may comprise a divider circuit to attenuate an input signal to produce an attenuated input signal; a capacitive circuit to store the attenuated input signal; and an integrator to augment the attenuated signal in accordance with a feedback loop that takes into account a voltage associated with the control input of the transistor. The attenuated signal augmented by the integrator may correspond to the attenuated second signal. The feedback loop may comprise the transistor; a variable gain amplifier electrically connected to the transistor; and a resistive-capacitive circuit electrically connected between the variable gain amplifier and the integrator. The low frequency circuit path may comprise an integrator functioning as a low-pass filter to pass the attenuated signal between the divider circuit and the capacitive circuit. The high-frequency circuit path may comprise a capacitive circuit. The capacitive circuit may comprise a first capacitor in series with the transistor and a second capacitor electrically connected between the first capacitor and the transistor. The second capacitor may be electrically connected between ground and a circuit path comprising the first capacitor and the transistor.

This patent application also describes a digital storage oscillator (DSO) comprising an analog to digital converter (ADC) to convert an input analog signal into a digital signal in accordance with a clock signal; and circuitry to generate a trigger signal. The circuitry may comprise a comparator to identify a trigger event for the analog input signal; an edge selector to identify a rising or falling edge of a signal output by the comparator and to produce an asynchronous trigger signal; and a latch to output the trigger signal based on the asynchronous trigger signal and a version of a clock signal. The DSO may further comprise a time interval digitizer to determine a time difference that is based on the asynchronous trigger signal, the time difference being a difference between an actual time that the trigger event occurred and a time that a clock signal running the ADC occurred; and an attenuator circuit to produce the input analog signal. The attenuator circuit may comprise a high-frequency circuit path to produce an attenuated first signal; a low-frequency circuit path to produce an attenuated second signal, the attenuated first signal having a higher frequency than the attenuated second signal; and a transistor comprising a control input, the control input to receive the attenuated second signal to bias the transistor for passage of the attenuated first signal and the attenuated second signal. A combination of the attenuated first signal and the attenuated second signal may correspond to the input analog signal. The DSO may include one or more of the following features, either alone or in combination.

The low-frequency circuit path may comprise a divider circuit to attenuate an input signal to produce an attenuated input signal; a capacitive circuit to store the attenuated input signal; and an integrator to augment the attenuated signal in accordance with a feedback loop that takes into account a voltage associated with the control input of the transistor. The attenuated signal augmented by the integrator may correspond to the attenuated second signal. The feedback loop may comprise the transistor; a variable gain amplifier electrically connected to the transistor; and a resistive-capacitive circuit electrically connected between the variable gain amplifier and the integrator. The low frequency circuit path may comprise an integrator functioning as a low-pass filter to pass the attenuated signal between the divider circuit and the capacitive circuit. The high-frequency circuit path may comprise a capacitive circuit. The capacitive circuit may comprise a first capacitor in series with the transistor and a second capacitor electrically connected between the first capacitor and the transistor. The second capacitor may be connected between ground and a circuit path comprising the first capacitor and the transistor. The DSO may further comprise memory; and a controller to capture data from the ADC based on the time difference, and to store the data in the memory.

Any two or more of the features described in this summary section may be combined to form embodiments not specifically described in this patent application.

All or part of the foregoing may be implemented as a computer program product comprised of instructions that are stored on one or more machine-readable media, and that are executable on one or more processing devices. All or part of the foregoing may be implemented as an apparatus, method, or system that may include one or more processing devices and memory to store executable instructions to implement functionality.

The details of one or more examples are set forth in the accompanying drawings and the description below. Further features, aspects, and advantages will become apparent from the description, the drawings, and the claims.

DETAILED DESCRIPTION

Described herein is an attenuator circuit comprising a high-frequency circuit path to produce an attenuated first signal, a low-frequency circuit path to produce an attenuated second signal, where the attenuated first signal has a higher frequency than the attenuated second signal, and a transistor comprising a control input. The control input is for receiving the attenuated second signal to bias the transistor for passage of the attenuated first signal and the attenuated second signal. In one embodiment, the attenuator circuit is a DC-coupled (Direct Current-coupled), wideband attenuator and amplifier, which includes a dual-path or composite architecture that splits DC and AC (Alternating Current) components of the input signal, processes them separately, and then recombines them to restore a wideband response. The attenuator circuit addresses the problem of recombining high- and low-frequency (e.g., DC) components of the signal to achieve flat frequency response, while allowing the use of relatively small capacitors to couple the AC portion of the circuit. For example, such capacitors may be between 2 pF and 1000 pF. For example, in a DSO using an attenuator with a 10:1 attenuation ratio, capacitors 14 and 17 (FIG. 1) might be 5 pF and 45 pF, respectively.

In this regard, composite amplifiers, comprised of separate AC coupled and DC coupled signal paths, are widely used to obtain flat, broadband amplification with relatively high DC precision. The attenuator circuit described herein, however, has several advantages relative to existing circuits. For example, the attenuator circuit works to protect delicate high-frequency circuitry from overvoltage and electrostatic discharge (ESD). The attenuator circuit does not require high-frequency circuitry to maintain high DC accuracy. In addition, the attenuator circuit enables the use of relatively small capacitors, which lowers the input capacitance and improves the high-frequency performance of the overall circuit. The smaller AC coupling capacitors better protect the attenuator circuit.

Figure 1:
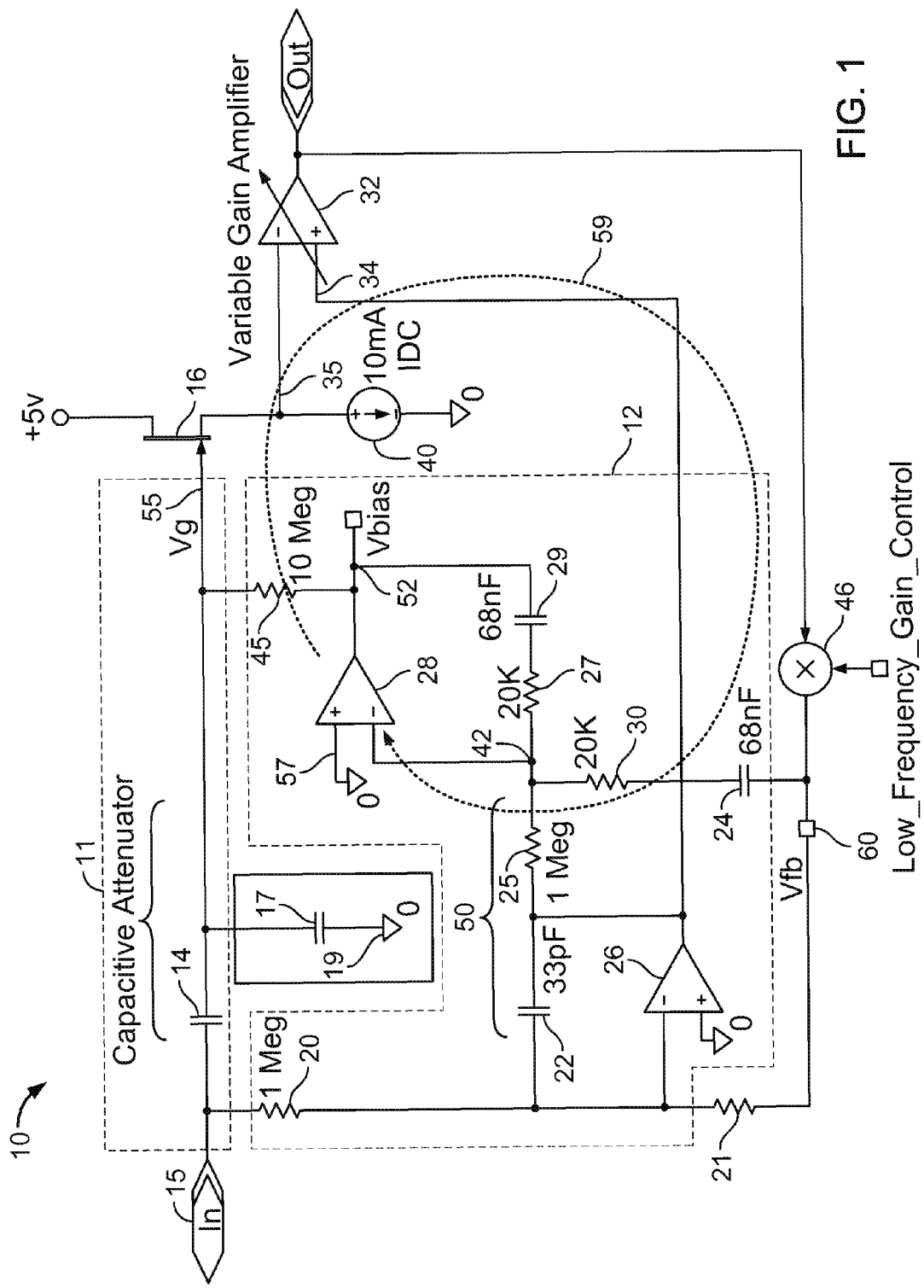
FIG. 1 is a diagram of an attenuator circuit.

FIG. 1 shows an example of the attenuator circuit described above. Circuit 10 includes a high-frequency circuit path 11 which attenuates high-frequency signals. A low-frequency circuit path 12 (e.g., a DC circuit path) attenuates signals that are lower in frequency (e.g., to DC) than the signals attenuated by the high-frequency circuit path 11. Low-frequency circuit 12 path also attenuates mid-range frequencies, e.g., those frequencies between DC and the high frequencies attenuated by high-frequency circuit path 11.

High-frequency circuit path 11 includes a first capacitor 14 electrically connected in series between input terminal 15 and transistor 16. In this context, electrical connection includes any type of connection that allows an electrical signal to pass between two components. Accordingly, electrical connection may include circuit paths that have intervening component(s) between two electrically-connected components.

In this example, transistor 16 is a JFET (Junction Field Effect Transistor); however, other types of transistors may be used either alone or in combination with a JFET. High-frequency circuit path 11 may also include a second capacitor 17, which is electrically connected between circuit path 11 and a reference potential 19, such as ground. Capacitors 14 and 17, which together make up a capacitive circuit, attenuate high-frequency components of the signal input to circuit 10 via input terminal 15. This signal is typically a voltage, and may be an input to an electrical instrument, such as a digital storage oscilloscope (DSO).

Low-frequency circuit path 12 includes a resistive divider circuit which, in this example, includes resistors 20 and 21. Additional resistors may be included in the divider circuit in a configuration different than that shown. Low-frequency circuit path 12 also includes capacitor 22, which acts as an integrator, together with capacitors 24, 29, resistors 25, 27, 30, 45, and integrators 26, 28, which are described below.

Low-frequency circuit path 12 operates to attenuate the low-frequency (e.g., DC) component of the input signal, and to control the gate (control input) voltage (Vbias) of transistor 16 so that transistor 16 maintains substantially the same transmission characteristics for all voltage frequencies being transmitted through the transistor.

The output of high-frequency circuit path 11 passes through transistor 16, to differential variable gain amplifier (VGA) 32, where it is combined with an output of low-frequency circuit path 12 to produce a signal that is attenuated over a range of (e.g., all) frequencies. In this regard, as explained below, the output of low-frequency circuit path 12 remains substantially constant, thereby resulting in a nearly constant input to input terminal 34 of VGA 32. However, low- and mid-range frequency signal components also pass through transistor 16, where they are combined with the high-frequency components and provided to input terminal 35 of VGA 32. VGA 32 uses the signal at input terminal 35 and the substantially constant signal at input terminal 34 to generate the output, attenuated signal at output terminal 37.

As shown in FIG. 1, transistor 16 is biased by a constant current source 40. This type of biasing causes transistor 16 to operate at enhanced transconductance and reduces the sensitivity of the transconductance to transistor process variation. Transistor 16 can be biased above $I_{DSS}$ (the drain current in the active region for $V_{GS}=0$), thereby increasing its transconductance and improving its speed, while also stabilizing the transconductance to attain relatively predictable and stable bandwidth across, e.g., all input signal frequencies.

When configured as shown in FIG. 1 in the prior art, transistor 16 is not self-biasing and self-bootstrapping. In this context, self-biasing refers to establishing and maintaining proper values of quiescent current and voltage in the transistor, and self-bootstrapping refers achieving very high (e.g., 1GΩ or greater) effective input resistance at the gate of the transistor, both without resorting to the use of additional active circuitry. To regain those characteristics, and the high input resistance at the gate of the transistor that they engender, the output of integrator 26 is configured to drive one of the input terminals 34 of VGA 32 with a DC signal rather than attempting to drive the gate of transistor 16 directly. Integrator 26 functions as a low-pass filter to pass the DC signal between the resistive divider circuit and output circuitry. The output of integrator 26 is also provided to integrator 28. As described below, integrator 28 integrates the output voltage of integrator 26 to servo the voltage at point 42 to about 0V via a feedback loop 59 that includes resistor 45, transistor 16, VGA 32, and low-frequency gain control multiplier 46. The voltage at point 42 also incorporates the relatively constant voltage of circuit path 50 which, in this implementation, includes capacitor 22 (an integrator) and resistor 25.

Capacitor 29 integrates the voltage at the output of integrator 26. That voltage is then provided, via resistor 45, to the gate of transistor 16, along with any contribution from integrator 28. Capacitor 29, in conjunction with capacitor 24, is also part of a feed forward path for frequency components in the mid-band frequency region between DC and frequencies at which capacitors 14 and 17 dominate the output response of the attenuator. Specifically, capacitor 24 bypasses integrator 26 and provides a relatively fast signal path for mid-range frequency signal components through bootstrapping bias resistor 45. This configuration enhances frequency response flatness in the mid-band frequency region. Resistor 30 promotes flattening the frequency response of the feedforward path. Resistor 27 also provides a leading phase to stabilize the feedback loop.

Calibration of low-frequency and high-frequency gains plays a role in flattening the overall frequency response and the mid-band frequency response. In the event that the attenuation provided by capacitors 14 and 17 does not match the attenuation provided by the ratio of resistors 20 to 21, adjustment of a low-frequency gain control 46 (via an external circuit—not shown) to match the DC and high-frequency gains automatically corrects the feedforward gain so that voltage Vbias at point 52 follows the voltage Vg at point 55 with sufficient accuracy to bootstrap the effective resistance of resistor 45 to values approaching 1GΩ. Resistors 30 and 27 dominate the ratio of voltage Vbias to the voltage Vfb at point 60 in the event of poor matching between capacitors 24 and 29. Since high accuracy resistors are lower cost and more readily available than high accuracy capacitors, resistors 27 and 30 provide an economical way of bootstrapping resistor 45 to relatively high values.

In a case where capacitors 14 and 17 attenuate the high-frequency components of the input signal differently than resistors 20 and 21 attenuate the low-frequency components of the input signal, the voltage at point 42 deviates from zero. In this case, the function of restoring the DC response at output 37 is performed by integrator 28, and not by changing the voltage at 34 (which remains constant, as noted above). Specifically, integrator 28 changes its output based on the voltage input to terminal 57 so that, through feedback loop 59, the voltage at point 42 servos back to zero. This reduces the signal swing required at transistor 16 and the input of VGA 32. It also enhances the circuit's high-frequency performance and ability to handle overdrive while maintaining linearity and speed.

The architecture of circuit 10 enables the use of relatively small AC coupling capacitors (e.g., capacitors 14 and 17) in a composite attenuator or amplifier. Small capacitors reduce the input capacitance of the system and improve high frequency performance. Small capacitors also make the system more rugged and tolerant to ESD and overvoltage. Circuit 12 bootstraps a bias resistor (e.g., resistor 45), lowering the frequency at which the crossover from DC to AC signal paths takes place. The precision of the bootstrapping circuit is obtained by exploiting a side effect of the normal flatness calibration process so that precision components and trimming are typically not needed in the high speed, AC coupled attenuator and amplifier path. The circuit avoids a configuration of existing designs that rely on heavy use of feedback to control crossover between the DC and AC signal paths.

Figure 2B:
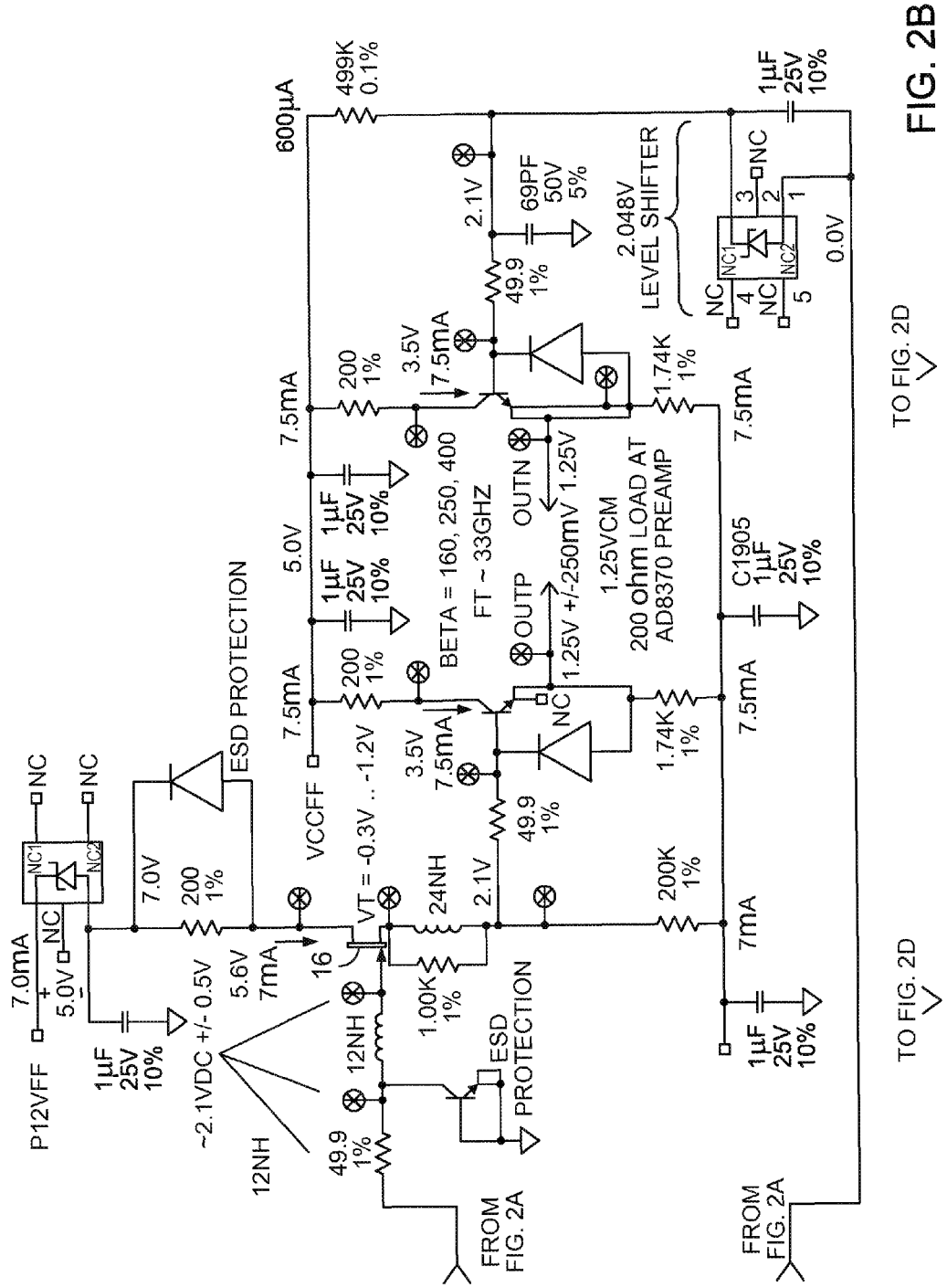
FIG. 2, comprised of FIGS. 2A, 2B, 2C and 2D, is a diagram showing an implementation of the attenuator circuit of FIG. 1.
Figure 2C:
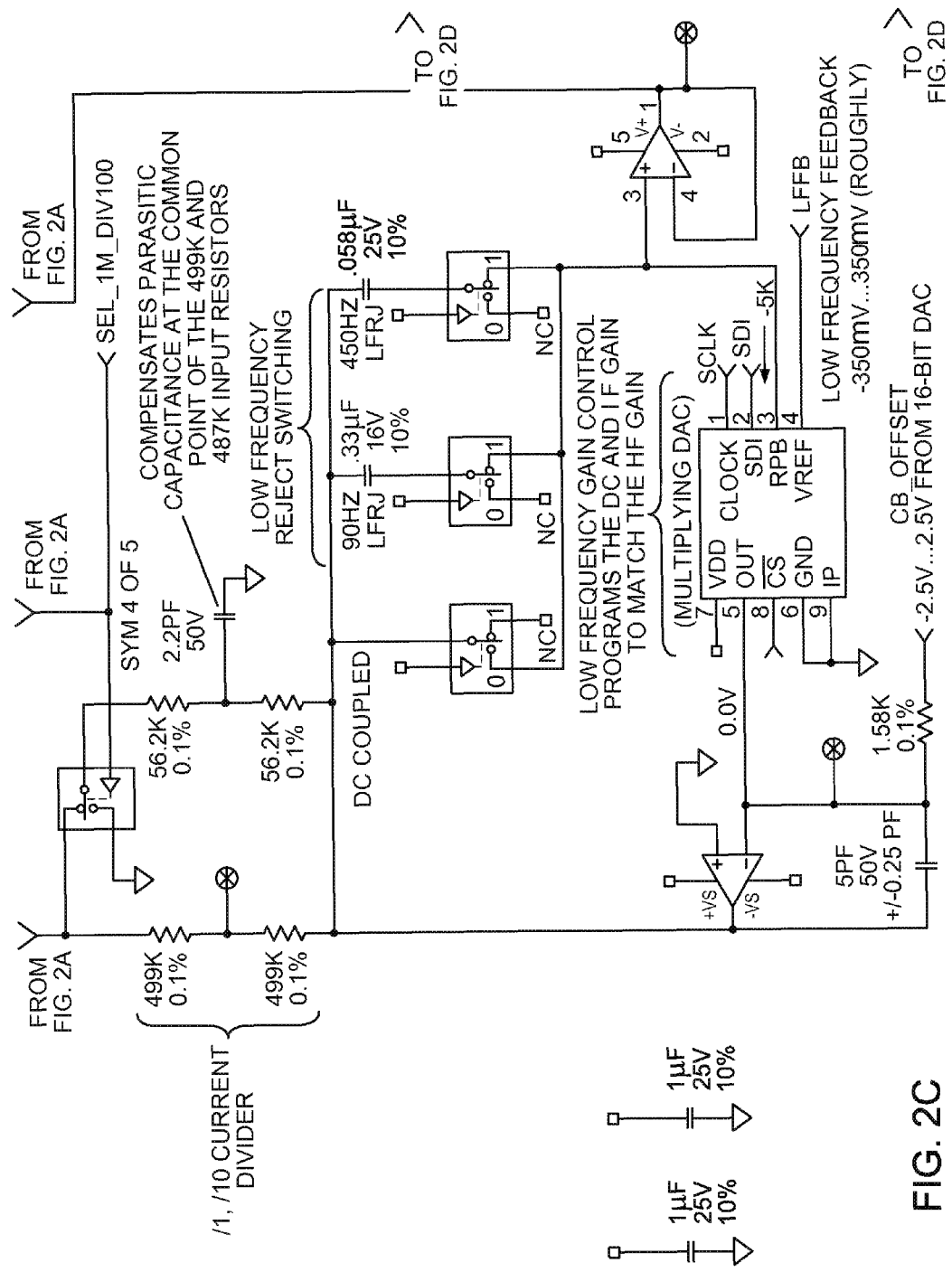
Figure 2D:
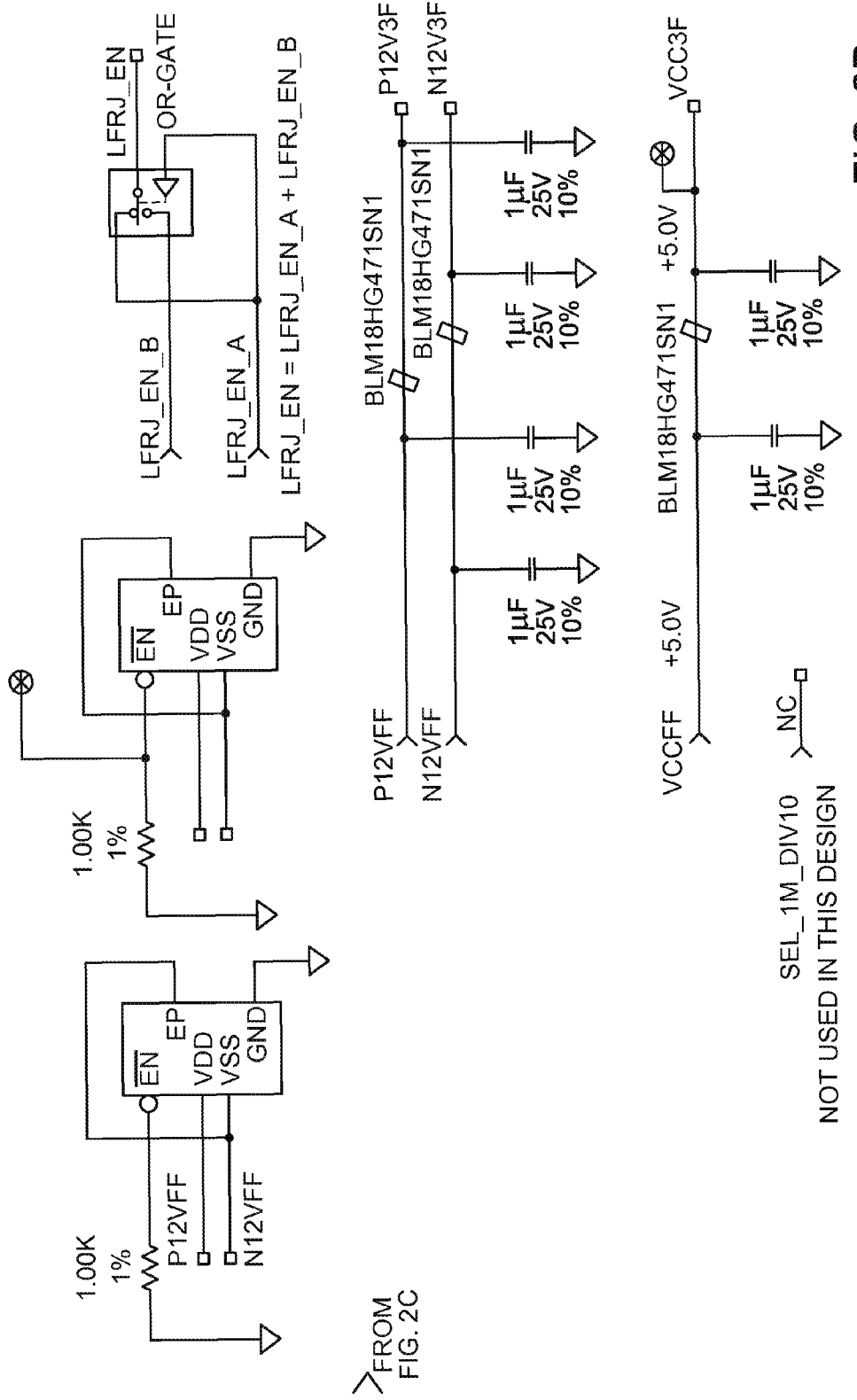

FIG. 2 shows an implementation of the circuitry shown in FIG. 1. Like reference numerals in FIGS. 1 and 2 indicate like elements.

Figure 3:
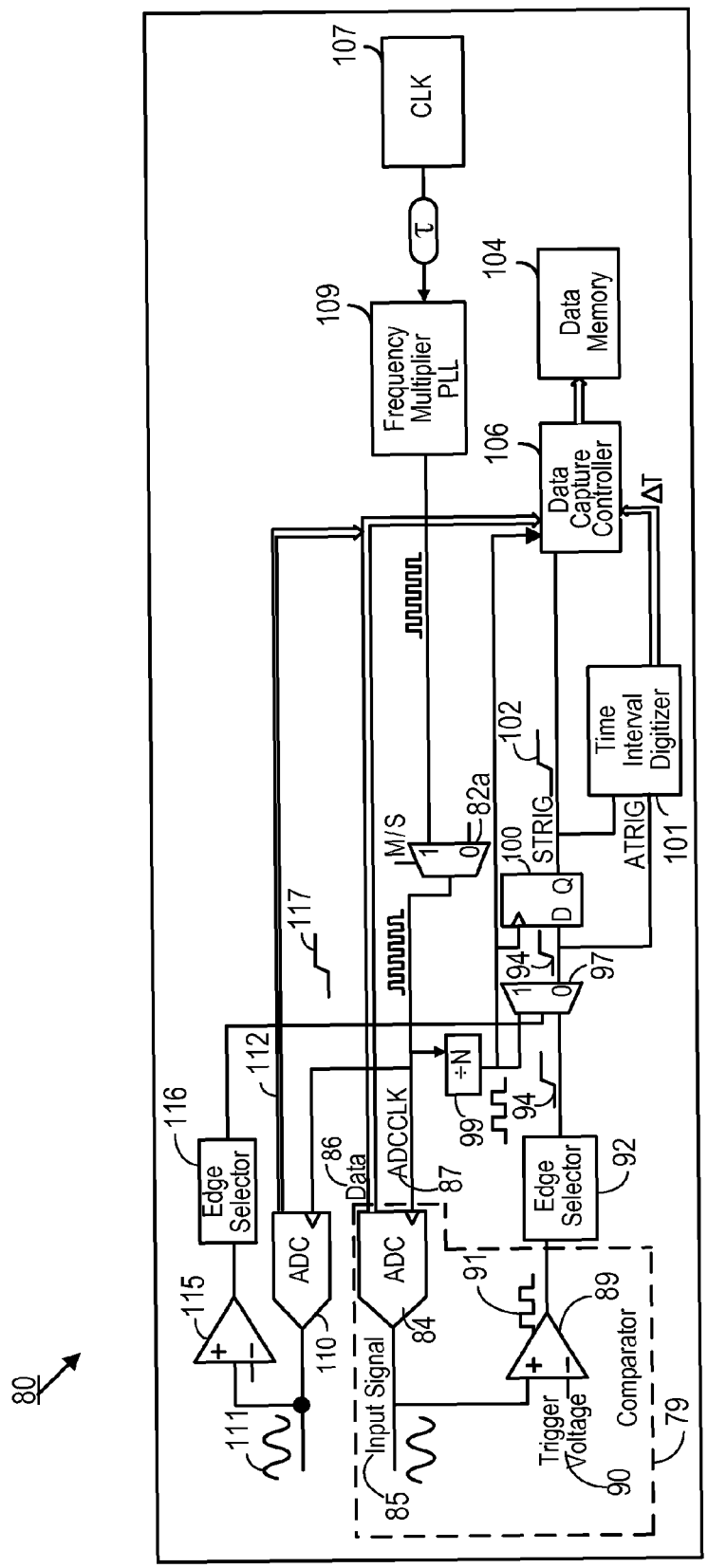
FIG. 3 is a block diagram of a digital storage oscilloscope (DSO) that may incorporate the circuit of FIG. 1 or of FIG. 2.

The circuitry shown in FIG. 1 or 2 may be incorporated into the front end of a DSO, such as that shown in FIG. 3. For example, the circuitry shown in FIG. 1 or 2 may be used to attenuate a high-amplitude signal to produce lower-amplitude input analog signal 85.

Referring to FIG. 3, DSO 80 includes an analog-to-digital converter (ADC) 84 for receiving an input analog signal 85 and for converting that analog signal to a digital signal 86 (i.e., digital data) in accordance with a clock signal 87. In this example, clock signal 87 is typically on the order of two gigahertz (2 GHz); however, any frequency may be used. The input analog signal 85 is the signal that the DSO will eventually reconstitute for display.

DSO 80 also includes a trigger comparator 89 to identify when input analog signal 85 exceeds a predefined voltage threshold. This is referred to as the threshold event, and is the point from which input analog signal 85 is referenced. Comparator 89 receives input analog signal 85 at its positive input and the voltage threshold 90 (threshold voltage) at its negative input. When input analog signal 85 exceeds voltage threshold 90, comparator 89 outputs a signal 91. Any type of signal may be used to indicate that an edge has been detected.

Figure 4:
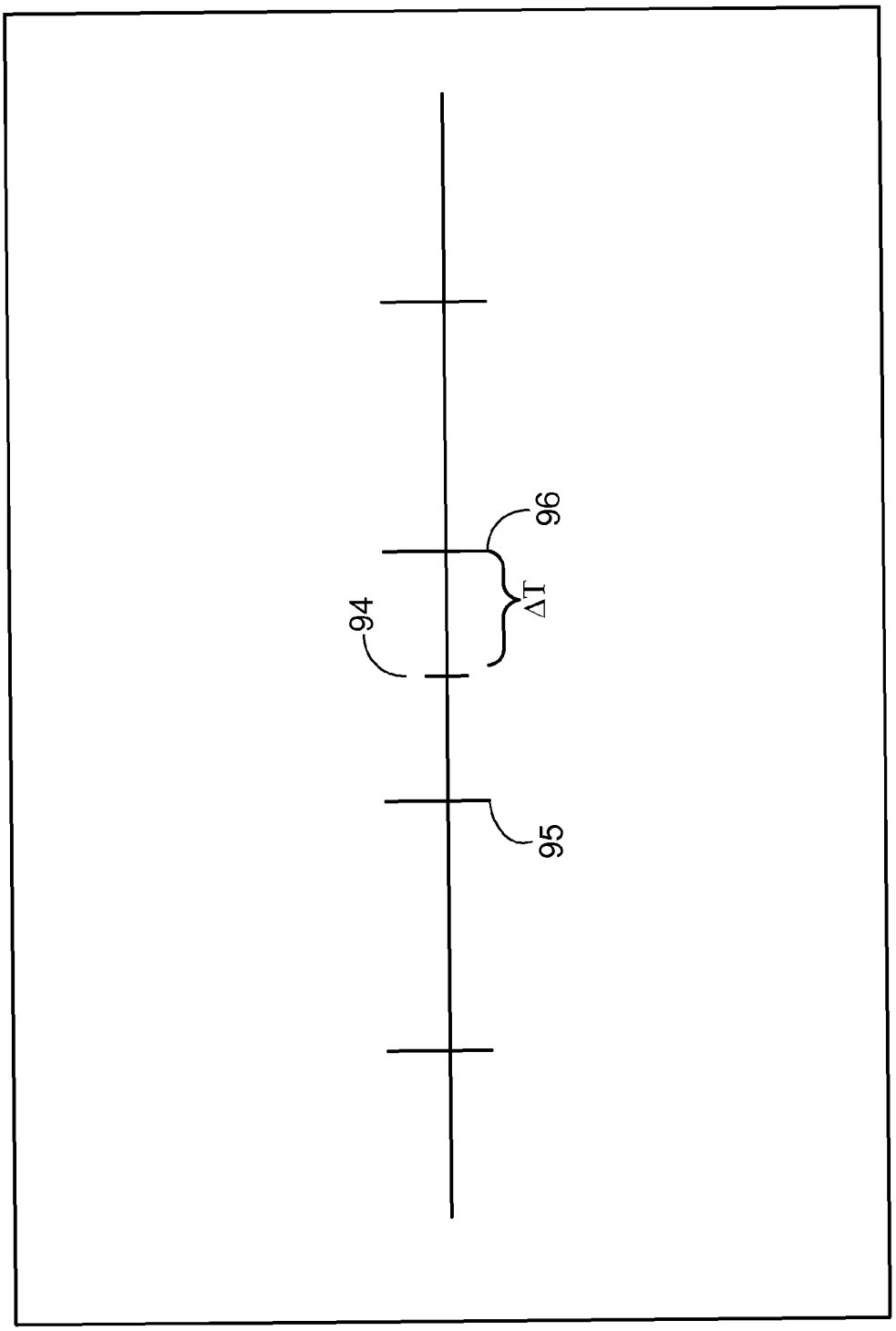
FIG. 4 is a plot showing a detected asynchronous trigger signal relative to pulses of a clock signal used to sample an input analog signal.

Edge selector 92 is a circuit that identifies either a rising edge or a falling edge of signal 91 output by comparator 89. The output of edge selector 92 constitutes an asynchronous trigger signal 94. Signal 94 is asynchronous because it is not in phase with clock signal 87. Rather, since signal 94 was detected in "real-time", it will likely fall in between two pulses 95, 96 of clock signal 87, as shown in FIG. 4.

Selector circuit 97 can be a flip-flop or other circuitry that is used to select, for output, either an asynchronous trigger signal (e.g., 94) or a version of clock signal 87. A step-down circuit 99 may be used to produce the version of clock signal 87. For example, step-down circuit 99 may reduce the frequency of clock signal 87. A purpose of the step-down circuit (divide-by-N block) is to reduce the clock rate to something more easily handled by the time interval digitizer and the circuitry that controls acquisition and data storage. The sample rate is reduced inside the data capture controller, and it is user programmable. Thus, the step-down circuit reduces the clock rate for practical signal handling purposes and does not change the functionality of the system. The user may set program the step-down circuit via a computer or other instrument controls communicatively coupled to DSO 10. The user may set this via a computer or other instrument controls communicatively coupled to DSO 80.

Assuming that selector circuit 97 selects asynchronous trigger signal 94, selector circuit 97 outputs asynchronous trigger signal 94 (ATRIG) to both a latch circuit 100 and a time interval digitizer 101. Latch circuit 100 receives asynchronous trigger signal 94 and, in accordance with clock signal 87 (the full or stepped-down version), outputs a synchronous trigger signal 102 (STRIG). Synchronous trigger signal 102 is synchronous because it is in phase with clock signal 87, unlike asynchronous trigger signal 94, which is likely not in phase with clock signal 87. In this regard, it is noted that, in some cases, synchronous trigger signal 102 and asynchronous trigger signal 94 may both be in phase with clock signal 87. These cases, however, are coincidental, and not necessarily intended.

Time interval digitizer 101 is a circuit and/or controller that determines the real-time difference (ΔT, also referred to as "initial X") between the asynchronous trigger signal 94 and the clock signal 87. The phase of clock signal 87 is represented, in time interval digitizer 101, by synchronous trigger signal 102, since synchronous trigger signal 102 is in phase with clock signal 87. Referring to FIG. 4, this difference is labeled ΔT. This difference, ΔT, is used by a microprocessor or other processing device (not shown) to reconstruct original analog signal 85 using digital data stored in data memory 104 for display on the DSO, and to relate original analog signal 85 to the detected trigger event.

DSO 80 also includes a data capture controller 106, which may be any type of microcontroller or other processing circuitry. Data capture controller 106 receives (e.g., "captures") data from ADC 84 in accordance with clock signal 87 (the full or stepped-down version). Data capture controller 66 stores this data, along with synchronous trigger signal 102 and ΔT in data memory 104. As noted above, a microprocessor or other processing device uses this information to reconstruct the original analog signal for display on the DSO.

As shown in FIG. 3, clock signal 87 may be generated by a device 107, such as an oscillator. A frequency multiplier phase-locked loop circuit 109, or other circuitry, may optionally be used to increase the frequency of the clock.

DSO 80 may be two-channel, meaning that two separate input analog signals can be tracked relative to the same internal trigger signal. So, in FIG. 3, DSO 80 contains a second ADC 110 for receiving a second input analog signal 111. The second ADC 111 receives clock signal 87, and produces a second digital signal 112. Second digital signal 112, is provided to, and stored via, data capture controller 106 in the manner described above. DSO 80 also includes a second comparator 115 and a second edge selector circuit 116 for generating a second asynchronous trigger signal 117. These components may have the same structure and function as their counterparts described above. Selector circuit 97 selects either the first asynchronous trigger signal 94 or the second asynchronous trigger signal 117 for subsequent processing to determine ΔT. The selected asynchronous trigger signal is processed by the downstream DSO circuitry in the manner described above.

A microprocessor or other processing device or circuitry may use the digital data and ΔT values to reproduce the original analog signals, and relate them to the same triggering event.

Any of the functionality described herein and their various modifications (hereinafter "the functions"), are not limited to the hardware and software described herein. All or part of the functions can be implemented, at least in part, via a computer program product, e.g., a computer program tangibly embodied in an information carrier, such as one or more machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

Components of different embodiments described herein may be combined to form other embodiments not specifically set forth above. Components may be left out of the circuitry shown in FIGS. 1 to 3 without adversely affecting their operation. Furthermore, various separate components may be combined into one or more individual components to perform the functions described herein.

Any components of the following patent applications may be combined to produce embodiment(s) not specifically described herein: (1) U.S. patent application Ser. No. 12/769,065, entitled "Connecting Digital Storage Oscilloscopes", (2) U.S. patent application Ser. No. 12/769,082, entitled "Driving An Electronic Instrument", and (3) U.S. patent application Ser. No. 12/769,075, entitled "Multi-Level Triggering Circuit", Resistive and capacitive values may be different than those shown.

Other embodiments not specifically described herein are also within the scope of the following claims.

What is claimed is:

1. An attenuator circuit comprising:
   a high-frequency circuit path to produce an attenuated first signal;
   a low-frequency circuit path to produce an attenuated second signal, the attenuated first signal having a higher frequency than the attenuated second signal; and
   a transistor comprising a control input, the control input being biased by the attenuated second signal, the control input for receiving at least the attenuated first signal while being biased by the attenuated second signal.

2. The attenuator circuit of claim 1, wherein the low-frequency circuit path comprises:
   a divider circuit to attenuate an input signal to produce an attenuated input signal;
   a capacitive circuit to store the attenuated input signal; and
   an integrator to augment the attenuated signal in accordance with a feedback loop that takes into account a voltage associated with the control input of the transistor, wherein the attenuated signal augmented by the integrator corresponds to the attenuated second signal.

3. The attenuator circuit of claim 2, wherein the feedback loop comprises:
   the transistor;
   a variable gain amplifier electrically connected to the transistor; and
   a resistive-capacitive circuit electrically connected between the variable gain amplifier and the integrator.

4. The attenuator circuit of claim 1, wherein the low frequency circuit path comprises an integrator functioning as a low-pass filter to pass the attenuated signal between the divider circuit and the capacitive circuit.

5. The attenuator circuit of claim 1, wherein the high-frequency circuit path comprises a capacitive circuit.

6. The attenuator circuit of claim 5, wherein the capacitive circuit comprises a first capacitor in series with the transistor and a second capacitor electrically connected between the first capacitor and the transistor.

7. The attenuator circuit of claim 6, wherein the second capacitor is electrically connected between ground and a circuit path comprising the first capacitor and the transistor.

8. A digital storage oscillator (DSO) comprising:
an analog to digital converter (ADC) to convert an input analog signal into a digital signal in accordance with a clock signal;
circuitry to generate a trigger signal, the circuitry comprising:
a comparator to identify a trigger event for the analog input signal;
an edge selector to identify a rising or falling edge of a signal output by the comparator and to produce an asynchronous trigger signal; and
a latch to output the trigger signal based on the asynchronous trigger signal and a version of a clock signal; and
a time interval digitizer to determine a time difference that is based on the asynchronous trigger signal, the time difference being a difference between an actual time that the trigger event occurred and a time that a clock signal running the ADC occurred; and
an attenuator circuit to produce the input analog signal, the attenuator circuit comprising:
a high-frequency circuit path to produce an attenuated first signal;
a low-frequency circuit path to produce an attenuated second signal, the attenuated first signal having a higher frequency than the attenuated second signal; and
a transistor comprising a control input, the control input being biased by the attenuated second signal, the control input for receiving at least the attenuated first signal while being biased by the attenuated second signal;
wherein a combination of the attenuated first signal and the attenuated second signal corresponds to the input analog signal.

9. The DSO of claim 8, wherein the low-frequency circuit path comprises:
a divider circuit to attenuate an input signal to produce an attenuated input signal;
a capacitive circuit to store the attenuated input signal; and
an integrator to augment the attenuated signal in accordance with a feedback loop that takes into account a voltage associated with the control input of the transistor, wherein the attenuated signal augmented by the integrator corresponds to the attenuated second signal.

10. The DSO of claim 9, wherein the feedback loop comprises:
the transistor;
a variable gain amplifier electrically connected to the transistor; and
a resistive-capacitive circuit electrically connected between the variable gain amplifier and the integrator.

11. The DSO of claim 8, wherein the low frequency circuit path comprises an integrator functioning as a low-pass filter to pass the attenuated signal between the divider circuit and the capacitive circuit.

12. The DSO of claim 8, wherein the high-frequency circuit path comprises a capacitive circuit.

13. The DSO of claim 12, wherein the capacitive circuit comprises a first capacitor in series with the transistor and a second capacitor electrically connected between the first capacitor and the transistor.

14. The DSO of claim 13, wherein the second capacitor is electrically connected between ground and a circuit path comprising the first capacitor and the transistor.

15. The DSO of claim 8, further comprising:
memory; and
a controller to capture data from the ADC based on the time difference, and to store the data in the memory.

* * * * *